United States Patent [19]
Clark

[11] Patent Number: 5,548,650
[45] Date of Patent: Aug. 20, 1996

[54] SPEAKER EXCURSION CONTROL SYSTEM

[75] Inventor: David L. Clark, Northville, Mich.

[73] Assignee: Prince Corporation, Holland, Mich.

[21] Appl. No.: 325,042

[22] Filed: Oct. 18, 1994

[51] Int. Cl.$^6$ .................................................. H03G 11/00
[52] U.S. Cl. ................................ 381/55; 381/100; 381/86
[58] Field of Search ................................ 381/99, 100, 55, 381/86

[56] References Cited

U.S. PATENT DOCUMENTS

| | | |
|---|---|---|
| 3,544,720 | 12/1970 | Corderman . |
| 3,890,465 | 6/1975 | Kaizu . |
| 3,925,708 | 12/1975 | Picciochi . |
| 3,962,607 | 6/1976 | Burns . |
| 4,122,507 | 10/1978 | Queen . |
| 4,296,278 | 10/1981 | Cullision et al. . |
| 4,327,250 | 4/1982 | von Recklinghausen . |
| 4,583,245 | 4/1986 | Gelow et al. .................. 381/100 |
| 4,987,564 | 1/1991 | Yokoyama ................... 381/96 |

Primary Examiner—Forester W. Isen
Attorney, Agent, or Firm—Price, Heneveld, Cooper, DeWitt & Litton

[57] ABSTRACT

A speaker excursion control circuit for driving relatively small diameter speakers at their maximum output while assuring minimum distortion of acoustical output from such transducers detects signals which may cause over excursion and dynamically controls the amplitude of signals applied to the power amplifier coupled to the speakers. In one embodiment of the invention a single state-variable filter is employed with a voltage controlled amplifier controlled by a low pass output of the state-variable filter to provide the speaker signal control. In another embodiment, a pair of state-variable filters are employed with the first of such filters defining a model for the speaker cone excursion and providing control output signals to a second state-variable filter which dynamically shifts its filtering characteristics causing increased signal attenuation when the control signals indicate that speaker over excursion may occur.

19 Claims, 2 Drawing Sheets

SPEAKER EXCURSION CONTROL SYSTEM

BACKGROUND OF THE INVENTION

The present invention pertains to vehicle audio systems and particularly to a speaker excursion control circuit for such audio systems.

Automotive sound systems have typically employed a plurality of speakers mounted in the instrument panels, door panels, rear package ledge or in floor consoles which permit the use of relatively large speakers of generally conventional design to allow for full range of both frequency and sound level for the reproduction of audio information. Although these speaker locations have provided adequate results, with the increased awareness of sound imaging through the increased popularity of, for example, home theater systems, purchasers of luxury vehicles expect and demand better audio performance from their vehicle's audio system. It has been discovered that by providing a new speaker platform, namely the headliner of the vehicle, and by using multiple, relatively small diameter speakers as opposed to the larger conventional speakers, the acoustical energy provided by the sound system can be precisely controlled in order to produce the desired "center-staging" and other acoustical effects for not only the driver of the vehicle but the remaining occupants as well. This desirable effect is achieved by providing relatively small (3"–5" diameter or other maximum dimension) speakers mounted directly on the vehicle headliner which is the decorative panel mounted to the roof of a vehicle. These speakers are employed for reproducing the more localizable frequencies of from about 150 Hz upwardly while conventional sub-woofers and woofers are employed and mounted in the vehicle for reproduction of the non-localizable lower frequencies. U.S. patent application Ser. No. 08/283,680; entitled Vehicle Audio System, filed on Aug. 1, 1994 discloses such an audio system for use in a vehicle.

One problem with the use of relatively small speakers in a vehicle is that they must be driven relatively hard (i.e. to their excursion limits) in order to generate sufficient acoustical energy. As a speaker is driven to its excursion limits, causing its voice coil to move to its outer limit of travel and leave the linear portion of the magnetic field of the permanent magnet, the diaphragm of the speaker becomes non-linear introducing audibly detectable and undesirable distortion. Some speakers are designed such that as the voice coil begins to leave the magnetic gap, a speaker suspension non-linearity is introduced to prevent the moving portions of a speaker from contacting its support frame thereby causing damage to the speaker. Although mechanically protecting the speaker, such a design also produces distortion in the reproduced audio information.

Therefore, it is desirable to provide, in connection with such speakers, a source of control signals which allow the speakers to be driven to, but not beyond, their excursion limits and to do so in an instantaneous fashion so that only those peak signals which might otherwise cause the speaker to introduce audible distortion are attenuated while at the same time simultaneously occurring signals which have little excursion requirement are passed. Thus, for example, the simultaneous occurrence of a trumpet tone and a drum beat which otherwise might cause distortion of the audible sound particularly affecting the trumpet tone, is desired to be controlled so that the drum beat only is briefly affected in order that the undistorted pure tone of the trumpet can be heard.

Although some systems have been proposed to prevent speaker damage through excessive motion, such circuits are designed only to operate on the overall energy applied to the speaker (i.e. the waveform envelope). As such, these systems do not differentiate between various signals with the result that both the peak signals capable of causing distortion and the simultaneously occurring high frequency signals are attenuated. Furthermore, these systems do not focus particular attention on the lower frequency signals which tend to require more speaker coil movement. Furthermore, the lower amplitude portions of the low-frequency signals are unnecessarily attenuated for a period of time after the peak, which might cause excess excursion, has passed.

SUMMARY OF THE PRESENT INVENTION

The system of the present invention overcomes the problems of driving relatively small diameter speakers at their maximum output while assuring minimally distorted acoustical output from such transducers by detecting those signals which may cause over excursion and dynamically controlling the corresponding signal amplitudes applied to the power amplifier which in turn is coupled to the speakers. In one embodiment of the invention a single state-variable frequency filter is employed with a voltage controlled amplifier controlled by the low pass output of the state-variable filter to provide the desired speaker signal control.

In another embodiment, a pair of state-variable filters are employed with the first of such filters defining a model for the speaker cone excursion. The model for the speaker is a portion of the circuit which has as its input an audio frequency signal from which it produces an output voltage proportional to the axial displacement of a loudspeaker cone driven by said audio frequency signal. The displacement may be referenced to the frame or to a part of the magnetic structure. Each type of speaker requires a distinct model because speaker resonance frequency, damping and force to moving-mass ratio determine the characteristics of the model. The model provides a continuous prediction of speaker excursion, not measurement. This circuit provides control output signals to a second state-variable filter which dynamically shifts its filtering characteristics causing increased signal attenuation when those control signals indicate that speaker over excursion may occur. In both embodiments of the invention, a current source amplifier is employed for driving the speakers.

In the vehicle audio system embodying such circuits, each speaker employed for reproducing frequencies of approximately 150 to 15,000 Hz will incorporate such an excursion control circuit to optimize the accuracy of sound reproduction in an overall installation. With the speaker control circuit of the present invention, therefore, a plurality of relatively small speakers can be mounted in the vehicle headliner to provide undistorted, high sound level acoustical reproduction of signals from signal sources having a wide dynamic range such as a compact disc player or the like. Relatively inexpensive speakers having a mechanical Q in the range of 0.5 to 0.7 can be employed in such a system. Electronic over-excursion protection is provided rather than mechanical stops. Instantaneous onset and release of limiting at the point of maximum allowable excursion is provided and limiting of, substantially, only the frequency components causing excess excursion is provided. These and other features, objects and advantages of the present invention will become apparent upon reading of the following description thereof together with reference to the accompanying drawings in which:

DETAILED DESCRIPTION OF THE PREFERRED EMBODIMENT

Figure 1:
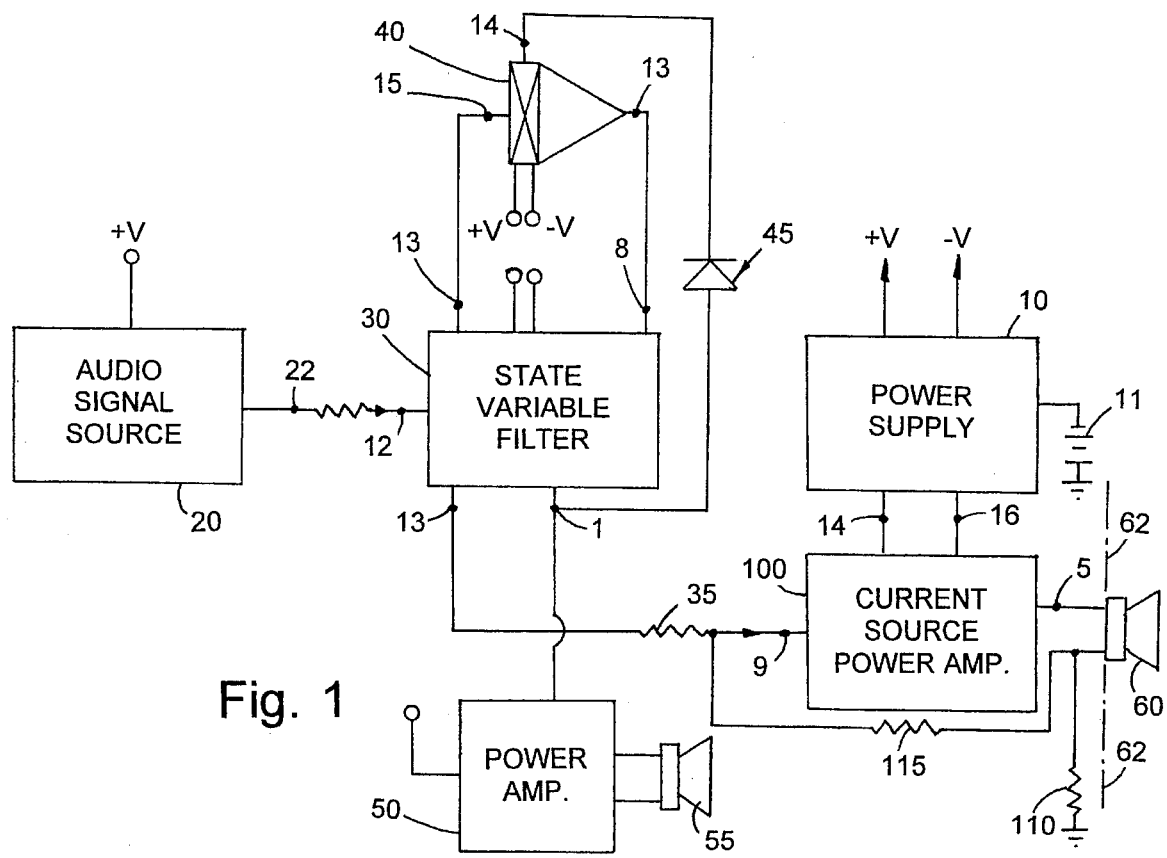
FIG. 1 is an electrical circuit diagram in block and schematic form of a sound system incorporating the circuit of the present invention.

Referring initially to FIG. 1, there is shown a sound system which may be incorporated into a vehicle. The system includes a power supply 10 coupled to the vehicle's battery 11 through conventional wiring to provide +V and −V voltages to supply power to the remaining circuit elements coupled as indicated by the associated terminals. Furthermore, the power supply 10 provides, through output conductors 14 and 16, operating power to a current source power amplifier 100 by means of plus and minus 24 volt rails respectively. The power supply 10 can provide this voltage from the vehicle's 12 volt battery 11 by employing a conventional switch mode DC/DC converter circuit. The electrical system shown in FIG. 1 includes an audio signal source 20 which can be a tuner, compact disc player, tape player, or a conventional automotive stereo system which combines these three sound sources into a single unit. The audio signal source 20 has an output terminal 22 supplying relatively low amplitude audio signals selected from the head end of the audio signal source (i.e. tuner, compact disc player or tape player). The selected audio signals are applied through an input scaling resistor 25 to an input terminal 12 of a state-variable filter 30 which, as described in greater detail below in connection with the detailed circuit diagram of FIG. 2., determines the excursion limit for a given speaker.

The state-variable filter consists of an electronic circuit 40 consisting of cascaded integrators and a summing block that combines input and feedback signals in the proper ratio to obtain a desired response. The circuit is essentially an analog computer model of a desired transfer function. In the present circuit, a two-integrator state-variable filter is used to model the driven spring-mass-damper system of the primary resonance of a loudspeaker. The outputs of the summing block and two cascaded integrators, respectively model acceleration, velocity and displacement of the cone motion. In one embodiment the state-variable filter is defined by the configuration of a commercially available active filter Model UAF-42 available from the Burr-Brown Company with external resistors as shown in detail in FIG. 2. For purposes of FIG. 1, the terminal numbers of the commercially available integrated circuit chip are shown in the block diagram 30 of the state-variable filter. Thus, state-variable filter 30 includes an input terminal 12, a high frequency output terminal 13, a low frequency output terminal 1, and a control input terminal 8 as shown in the block diagram. Terminal 13 is shown in FIG. 1 in two locations for the sake of simplification of the diagram with the exact circuit details being shown in FIG. 2. Coupled between the high frequency output terminal 13 and the control input terminal 8 is a voltage controlled amplifier circuit 40 which receives audio input signals at its input terminal 15 and control signals at its control input terminal 14 and supplies controlled output signals at its output terminal 13. Voltage controlled amplifier circuit 40 may also be provided by a commercially available integrated circuit chip such as a current controlled amplifier type SSM 2024 made by Precision Monolithics Company which includes four such voltage controlled amplifiers, it being understood that for each speaker and state-variable filter, one or two of the voltage controlled amplifier circuits on the chips can be employed with each of the circuits. As with the state-variable filter 30, the pin numbers for the commercially available integrated circuit chip for multiplier 40 are shown in FIG. 1. A silicone diode 45 such as an 1N914 has its anode coupled to the low frequency output terminal 1 of the state-variable filter 30 and its cathode coupled to the control input terminal 14 of the multiplier to provide an approximate 0.6 volts voltage drop for determining the threshold at which the attenuation of the state-variable filter becomes active as described below in connection with FIG. 2. The actual circuit shown in FIG. 2 includes a second diode for providing the negative half cycle frequency control for each of the signals applied to the state-variable-filter.

The low frequency output from terminal 1 of the state-variable filter 30 may optionally be coupled to a power amplifier 50 into a low frequency sound reproduction speaker 55 such as a woofer or sub-woofer for reproducing the lower frequencies (i.e. about below 150 Hz). This speaker may be located in any convenient vehicle area and the overall vehicle sound system may include one or more such speakers.

The high frequency output terminal 13 of the state-variable filter 30 is coupled through a 10K Ohm input resistor 35 to the input terminal 9 of a current source power amplifier 100 which may be a solid state high performance power amplifier such as a TDA 1514A integrated circuit available from Philips Semiconductors. The high frequency signals applied to input terminal 9 of the current source power amplifier 100 are amplified by the circuit and applied to an output transducer 60 such as a 3" to 5" diameter speaker having a mechanical Q in the range of about 0.5 to 0.7. This value of Q may be achieved by applying damping to a conventional speaker. The output terminal 5 of the 50 watt current source power amplifier 100 is coupled to one terminal of the speaker 60 with the remaining terminal of the speaker being coupled to ground through a current sensing resistor 110 having a value of. 0.1 Ohms. The voltage across the current sensing resistor is applied back to the input terminal 9 of the current source power amplifier 100 through a feed-back resistor 115 having a value of approximately 5K Ohms in order to control the amplifier gain as described in connection with FIG. 2 below.

The circuitry of FIG. 1 represents a speaker control circuit that controls one of the relatively small (i.e. 3" to 5" major dimension of the speaker cone) speakers for the high frequency signals and, optionally, one speaker for the low frequency signals. A similar circuit will be provided for each additional higher frequency transducer such as speaker 60 and lower frequency transducer such as woofer 55 used in a vehicle sound system. The transducers 60 are preferably mounted directly to the vehicle headliner as illustrated schematically by dashed line 62 in FIG. 1. The mounting arrangement of the transducers includes at least three such speakers in the left, center and right of the front of the vehicle and preferably includes a similar array of speakers at the center of the vehicle. The installation may also include a pair of such speakers at the opposite rear corner of the headliner.

The circuit of FIG. 1 responds to the signals on input terminal 12 by separating them into their corresponding low frequency and conditioned high frequency signals. The conditioning of the signals applied to current source power amplifier 100 and ultimately to the transducer 60 by the operation of the state-variable filter 30 in connection with the voltage controlled amplifier circuit 40 is now described in connection with the circuit diagram of FIG. 2.

Figure 2:
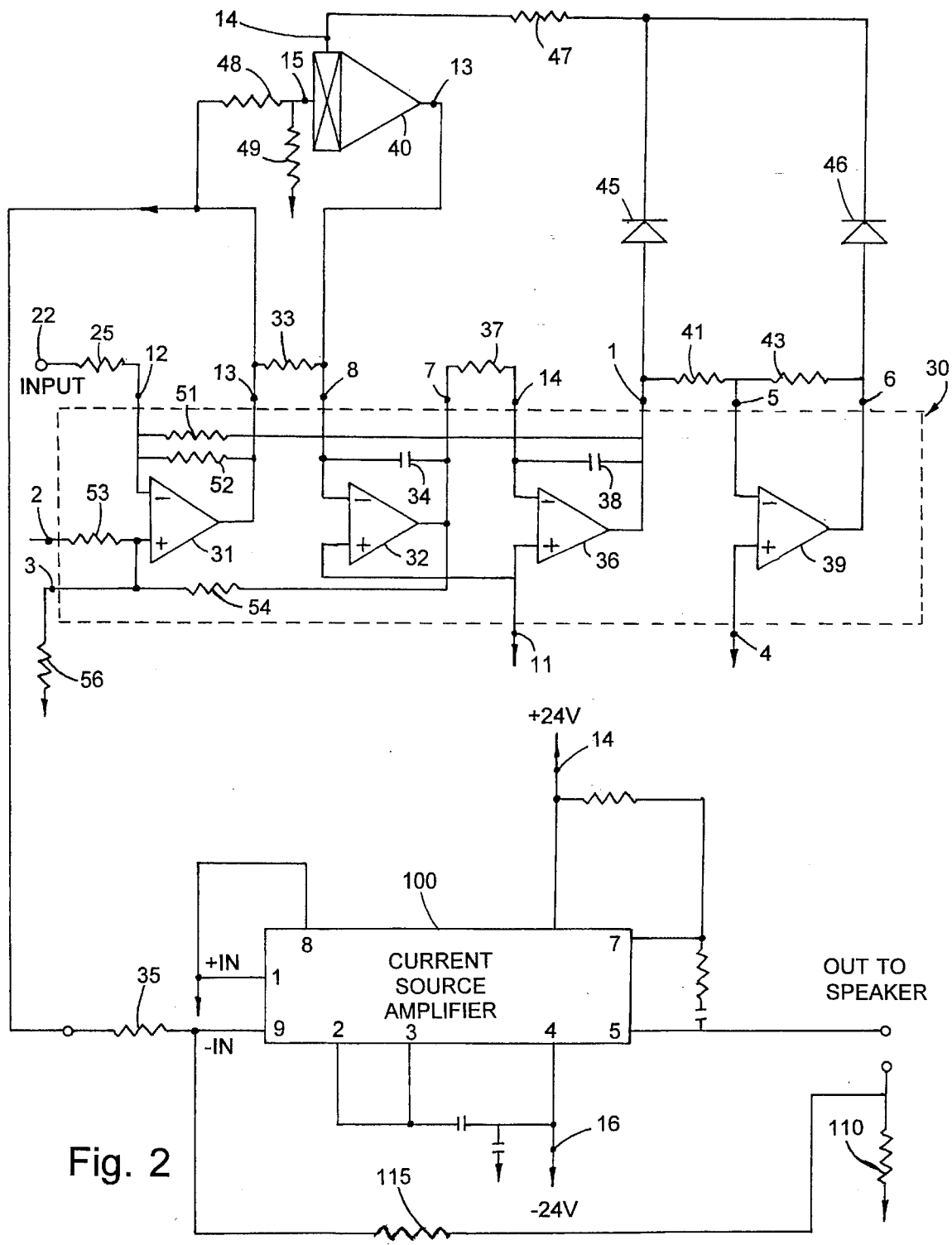
FIG. 2 is an electrical circuit diagram in block and schematic form showing the details of a portion of the circuit shown in FIG. 1.

Referring to FIG. 2, the state-variable filter 30 internal circuitry and the associated externally coupled circuit components are shown in greater detail as is the voltage controlled amplifier circuit 40 and current source power amplifier 100 and their interconnection to one another. The signals from the audio signal source 20 (FIG. 1) are applied to input terminal 12 of state-variable filter 30 to OPAMP 31. The output of OPAMP 31 is connected to high frequency output terminal 13 and also connected to a first integrating amplifier 32 through external 1M Ohm resistor 33.

The output of the first integrating amplifier 32 is coupled via terminal 7 to a second integrating amplifier 36 by external 1M Ohm resistor 37. The two integrating amplifiers define a 12 DB/Octave low pass filter having a low pass output terminal 1 coupled to the anode of a 1N914 diode 45. The cathode of diode 45 is coupled to the control input terminal 14 of voltage controlled amplifier circuit 40 by means of a 47K Ohm resistor 47. Thus, lower frequency output terminal 1 provides a low frequency component of the input signal from input terminal 12 to the control input terminal 14 of voltage controlled amplifier circuit 40.

The voltage of the signal applied from the low frequency output terminal 1 of the 12 DB/Octave low pass filter is offset by 0.6 of a volt by diode 45 to establish a threshold at which the voltage controlled amplifier gain will be adjusted in order to dynamically control the signal applied to terminal 8 of state-variable filter 30 from voltage controlled amplifier circuit 40. The diode 45 operates to pass the positive going signals at low frequency output terminal 1 while the negative going signals are effectively blocked by this diode.

In order to provide dynamic control for both halves of each cycle of operation, the signal at low pass output terminal 1 are applied to a negative half cycle amplifier 39 by means of an external 10K Ohm resistor 41. Amplifier 39 has an external 10K Ohm feed-back resistor 43 coupled between its negative input 5 and its output terminal 6 as shown. The output terminal 6 is coupled to the anode of a second 1N914 diode 46 having its cathode coupled to the control input terminal 14 of voltage controlled amplifier circuit 40 by means of resistor 47. Thus, the negative half cycles of the signal at low pass output terminal 1 will be inverted and offset by diode 46 and similarly applied to control input terminal 14 of voltage controlled amplifier circuit 40.

The input terminal 15 of voltage controlled amplifier circuit 40 receives the high frequency output signals from high pass output terminal 13 through a voltage divider network comprising resistors 48 and 49 comprising 10K Ohms and 200 Ohms respectively. The state-variable filter 30 integrated circuit capacitors 34 and 38 are each 1,000 pF while the internal resistors 51, 52, 53, and 54 are each 50K Ohms in order to achieve an approximate 170 Hz operating frequency. The positive input terminal of OPAMP 31 is coupled to ground by resistance 56 comprising a 47K Ohm resistor while input terminal 2 is unused.

In operation, the entire bandwidth of the audio signals from audio signal source 20 is applied to the input terminal 12 scaled by input scaling resistor 25. As the low frequency signals which are passed by integrating amplifiers 32 and 36 reach a level above 0.6 volts DC at low frequency output terminal 1, the voltage controlled amplifier circuit 40 receives a positive going signal at its control input terminal 14. This increases the gain of the amplifier thereby instantaneously feeding forward the audio signals at input terminal 15 of voltage controlled amplifier circuit, 40 to substantially instantaneously provide an effective reduction of the value of the parallel impedance including resistor 33 in the integrator circuit comprising resistor 33, capacitor 34, and first integrating amplifier 32. This reduction of the value of impedance shifts the effective frequency of filtering of the state-variable filter upwardly thereby increasing the range of signal output at low pass output terminal 1 which is applied back to the input terminal 12 of the state-variable filter 30 through the feed-back resistor 51 coupled to the negative input terminal of the OPAMP 31. This causes an instantaneous and significant increase in the attenuation of the lower frequency signals which may cause speaker over excursion while only slightly attenuating the desired higher frequency signals.

The resultant high pass output signals from state-variable filter 30 and terminal 13 are applied to the input terminal 9 of current source power amplifier 100 through input resistor 35. The input signal is amplified to provide a current output to speaker 60 at output terminal 5 of amplifier 100 which is directly proportional to the input signal voltage. The current applied to speaker 60 is sensed by the series coupled current sensing resistor 110 through which the current flows and the resultant voltage is applied to the input terminal 9 through 5K Ohm feed-back resistor 115. This state-variable filter 30 output produces speaker excursion limiting by limiting of the current, and therefore the predicted motion of the speaker cone.

Thus, the state-variable filter 30 provides variable attenuation of particularly the low frequency signals, substantially eliminating their effect on the output applied to the current source power amplifier 100 in a dynamic substantially instantaneous fashion which increases the attenuation and frequency characteristics of the state-variable filter as the amplitude of the lower frequency signals increase. When combined with the current sensing through the current source power amplifier 100, relatively small headliner mounted speakers can effectively provide undistorted, relatively high sound pressures throughout the frequency range of from about 150 Hz to 15 Khz. It is noted here that it is typically desired to add additional damping to the speaker 60 from their conventional commercial construction by providing, for example, felt damping material adhered to the openings in the speaker basket using conventional adhesive. This additional damping to the speakers 60 damps their resonance when driven by the current source power amplifier 100. By employing a pair of state-variable filters in an alternative embodiment of the present invention, the performance of the system can be enhanced even further utilizing the circuitry shown in FIG. 3.

Figure 3:
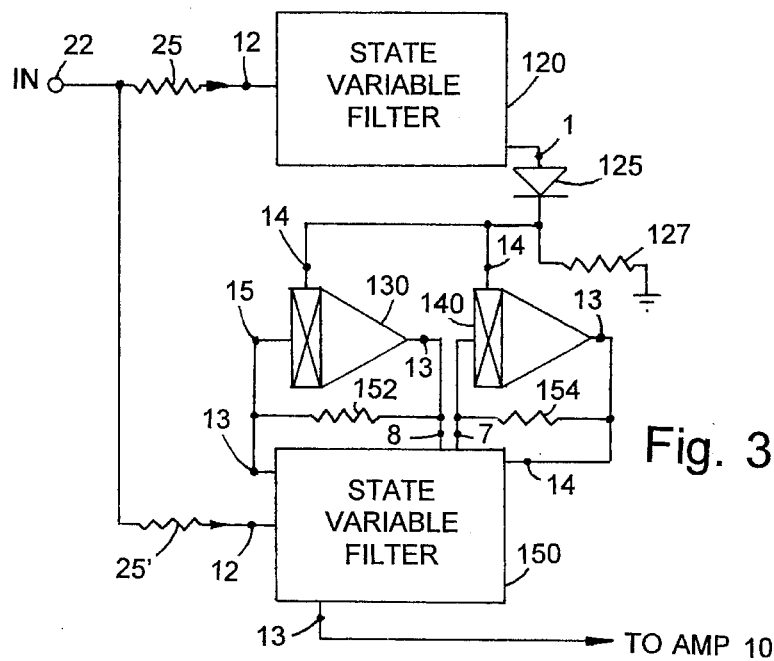
FIG. 3 is an electrical circuit diagram in block form of an alternative embodiment of the present invention.

In FIG. 3, a pair of state-variable filters 120 and 150 are employed. Each filter can be a UAF-42A with the first state-variable filter 120 utilizing only the input combining and two integrating amplifiers with the same 1M Ohm externally coupled resistors as circuit 30 shown in FIG. 2 to serve as a model for the excursion of the speaker cone 60. In FIG. 3, the audio signals from output terminal 22 of a source of audio signals are applied through a 51K Ohm resistor 25 to the input terminal 12 of the first state-variable filter 120 and through a 51K Ohm resistor 25' to input 12 of the second state-variable filter 150. The first state-variable filter 120 is coupled to external resistors as shown in FIG. 1 (i.e. resistors 33 and 37) and provides a 12 DB/Octave low pass filtered signal at first low frequency output terminal 1 which in turn is employed to control a second state-variable filter 150 which is also a UAF-42A filter with terminals connected as shown in FIG. 3.

The low pass frequencies from first state-variable filter 120 are not controlled by a voltage controlled amplifier circuit but are employed instead for controlling a pair of multiplier circuits 130 and 140 of the same type as voltage controlled amplifier circuit 40 shown in FIGS. 1 and 2. A diode 125 provides a 0.6 volt voltage drop such that signals having an amplitude below 0.6 of a volt from first low frequency output terminal 1 will not be applied to the control input terminals 14 of multiplier circuits 130 and 140, respectively. When, however, low frequency signals have an amplitude sufficient to exceed 0.6 volts, diode 125 will conduct. The resultant control voltages across resistor 127 FIG. 3 is applied to the control input terminal 14 of voltage controlled amplifier circuits 130 and 140. Each of the multiplier circuits 130 and 140, respectively, are coupled across 1M Ohm resistors 152 and 154 to provide double dynamic impedance varying on the attenuating characteristics of the second state-variable filter 150. Resistor 152 and parallel coupled voltage controlled amplifier 130 are coupled across terminals 13 and 8 of state-variable filter 150 while resistor 154 and parallel voltage controlled amplifier 140 are coupled between terminals 7 and 14 of the UAF-42A state-variable filter. Thus, when the amplitudes of the low frequency signals are applied to the control input terminal 14 of voltage controlled amplifier circuits 130 and 140, the frequency attenuation characteristics of second state-variable filter 150 shift upwardly to attenuate lower frequency components as well as frequencies slightly above the nominal 170 Hz static level. The resultant conditioned high pass signals are applied through high pass output terminal 13 to the input terminal 9 of current source power amplifier 100 shown in FIG. 2 through an input resistor 35 as in FIG. 2.

By providing two state-variable filters as shown in FIG. 3, the first state-variable filter models the speaker cone excursion and is used to control the integrating amplifiers of a second state-variable filter in order to instantaneously attenuate the audio signals by cutting off those amplitudes of the waveform which may cause over excursion. This clips off the deleterious low frequency peaks without affecting the higher frequency signals desired to be applied to the speaker. With this circuit, until such time as a signal which may result in an over excursion is received, the audio signals applied at input terminal 12 are essentially unaltered from the 170 Hz static setting by the second state-variable filter 150. As soon as lower frequency signals occur having amplitudes which may cause speaker over excursion and thus distortion, the second state-variable filter 150 responds to the control signals applied from filter 120 and multipliers 130 and 140 to substantially instantaneously limit these low frequency signals. As can be appreciated, the first state-variable filter 120 shown in FIG. 3 can be employed for providing a control signal for a plurality of separate state-variable filters 150 employed with each speaker 60 in a system.

In either embodiment, this system uses a state-variable filter and voltage controlled amplifier circuit to achieve dynamic attenuation of audio signal frequencies which may cause over excursion while simultaneously passing those frequency signals which do not cause over excursion. Furthermore, a current source power amplifier is provided and is implemented with a speaker current sensing resistor. It will become apparent to those skilled in the art that various modifications to the preferred embodiments of the invention as described herein can be made without departing from the spirit or scope of the invention as defined by the appended claims.

The embodiments of the invention in which an exclusive property or privilege is claimed are defined as follows:

1. A speaker excursion limiting circuit comprising:

a state-variable filter having an input for receiving audio frequency signals, a control input, a low pass output and a high pass output for coupling to a power amplifier; and a voltage controlled amplifier circuit having a signal input coupled to said high pass output of said state-variable filter, an output terminal coupled to said control input of said state-variable filter and a control input coupled to said low pass output of said state-variable filter, wherein said state-variable filter responds to signals applied to said control input of said state-variable filter to limit the amplitude of signals at said high pass output to prevent over excursion of a speaker coupled to said high pass output of said state-variable filter through a power amplifier.

2. The circuit as defined in claim 1 and further including a diode coupled in series between said low pass output of said state-variable filter and said control input of said voltage controlled amplifier.

3. The circuit as defined in claim 2 wherein said state-variable filter includes an inverting amplifier having an input coupled to said low pass output and an output, and a second diode coupling said output of said inverting amplifier to said control input of said voltage controlled amplifier circuit.

4. The circuit as defined in claim 1 and further including a current source amplifier having an input coupled to said high pass output terminal of said state-variable filter and an output terminal for coupling to a speaker.

5. The circuit as defined in claim 4 and further including a current sensing resistor coupled in series with said output terminal of said current source amplifier and a feedback resistor coupling said current sensing resistor to said input of said current source amplifier.

6. A speaker excursion limiting circuit comprising:

a first state-variable filter having a signal input terminal for coupling to a source of audio frequency signals and a low pass output terminal;

first and second voltage controlled amplifier circuits, each of said voltage controlled amplifier circuits including a control input terminal coupled to said low pass output of said first state-variable filter, said first and second voltage controlled amplifiers each further including a signal input terminal and an output terminal; and a second state-variable filter having a signal input terminal coupled to said signal input terminal of said first state-variable filter, said second state-variable filter having a high pass output terminal coupled to said signal input terminal of a first one of said voltage controlled amplifier circuits and for providing output signals, said second state-variable filter including first and second control input terminals, wherein said output terminal of said first voltage controlled amplifier is coupled to said first control input terminal of said second state-variable filter and said output terminal of said second voltage controlled amplifier is coupled to said second control input terminal of said second state-variable filter such that said low pass signals from said first state-variable filter controls said voltage controlled amplifier and said second state-variable filter to shift the filtering characteristics of said second state-variable filter for limiting audio signals which are applied at said high pass output terminal to protect a speaker coupled to said high pass output terminal of said second state-variable filter from over excursion.

7. The circuit as defined in claim 6 and further including a current source power amplifier having an input coupled to said high pass output of said second state-variable filter and an output terminal for coupling to a speaker.

8. The circuit as defined in claim 7 and further including a current sensing resistor coupled in series with said output terminal of said current source amplifier and a feedback resistor coupling said current sensing resistor to said input of said current source amplifier.

9. A speaker excursion limiting system comprising:

an audio signal source having an output terminal supplying audio signals;

a voltage controlled amplifier circuit having an input terminal, a control input terminal, and an output terminal supplying a controlled output signal;

a state-variable filter having an input terminal coupled to said output terminal of said audio signal source, said state-variable filter having a first integrating amplifier coupled to a second integrating amplifier to form a low pass filter, said low pass filter separating said audio signals into their low frequency components, said state-variable filter having a input combining amplifier, said input combining amplifier negatively summing said low frequency components with said audio signals to separate said audio signals into their high pass components, said state-variable filter having a higher frequency output terminal supplying said high pass components, said high pass output terminal coupled to said input terminal of said voltage controlled amplifier circuit, said state-variable filter having a low pass output terminal supplying said low pass components, said low pass output terminal coupled to said control input terminal of said voltage controlled amplifier circuit, said state-variable filter having a control input terminal coupled to said output terminal of said voltage controlled amplifier circuit, said output control signals of said voltage controlled amplifier circuit causing the effective frequency of filtering of said low pass filter of said state-variable filter to be increased when the voltage amplitude of said low pass components received by said control input terminal of said voltage controlled amplifier circuit exceeds a preset threshold, said increase in filtering frequency causing the low frequency of said high frequency components to be further attenuated instantaneously;

a relatively small diameter speaker with a predetermined excursion characteristic having an input terminal coupled to said high pass output terminal of said state-variable filter; and a larger diameter speaker having an input terminal coupled to said low pass output terminal of said state-variable filter.

10. The speaker excursion limiting system defined in claim 9 and further comprising a power amplifier and a current source power amplifier, said power amplifier having an input terminal coupled to said low pass output terminal of said state-variable filter and an output terminal coupled to said larger diameter speaker, said current source power amplifier having an input terminal coupled to said high pass output terminal of said state-variable filter and an output terminal coupled to said relatively small diameter speaker.

11. The speaker excursion limiting system as defined in claim 10 wherein the current through said output terminal of said current source power amplifier is sensed by a current sensing resistor, said current sensing resistor coupled to said input terminal of said current source power amplifier through a feedback resistor such that the gain of said current source power amplifier is controlled.

12. A speaker excursion limiting system comprising:

an audio signal source having an output terminal supplying audio signals;

A first state-variable filter having an input terminal coupled to said output terminal of said audio signal source, said first state-variable filter having a first integrating amplifier coupled to a second integrating amplifier to form a first low pass filter, said first low pass filter separating said audio signals into their low frequency components, said first state-variable filter having a first low pass output terminal supplying said first low frequency components;

first and second voltage controlled amplifier circuits, each voltage controlled amplifier circuit having an input terminal, a control input terminal coupled to said first low pass output terminal of said first state-variable filter, and an output terminal supplying output control signals;

a second state-variable filter having an input terminal coupled to said output terminal of said audio signal source, said second state-variable filter having a third integrating amplifier coupled to a fourth integrating amplifier to form a second low pass filter, said second low pass filter separating said audio signals into their low frequency components, said second state-variable filter having an input combining amplifier, said input combining amplifier negatively summing said low pass components with said audio signals to separate said audio signals into their high pass components, said second state-variable filter having a high pass output terminal supplying said higher frequency components, said input and output terminals of said first and second voltage controlled amplifier circuits coupled to said second low pass filter, said output control signals of said pair of voltage controlled amplifier circuits causing the effective frequency of filtering of said second low pass filter of said second state-variable filter to be increased when the voltage amplitude of said first low frequency components received by said control input terminals of said pair of voltage controlled amplifier circuits exceeds a predetermined threshold, said increase in filtering frequency causing the lower portion of said higher frequency components to be further attenuated instantaneously;

a relatively small diameter speaker with a predetermined excursion characteristic having an input terminal coupled to said high pass output terminal of said second state-variable filter; and a larger diameter speaker having an input terminal coupled to said first low frequency output terminal of said first state-variable filter.

13. The speaker excursion limiting system as defined in claim 12 and further comprising a power amplifier and a current source power amplifier, said power amplifier having an input terminal coupled to said first low pass output terminal of said first state-variable filter and an output terminal coupled to said larger diameter speaker, said current source power amplifier having an input terminal coupled to said high pass output terminal of said second state-variable filter and an output terminal coupled to said relatively small diameter speaker.

14. The speaker excursion limiting system as defined in claim 13 wherein the current through said output terminal of said current source power amplifier is sensed by a current sensing resistor, and a feedback resistor coupling said current sensing resistor to said input terminal of said current source power amplifier such that the gain of said current source power amplifier is controlled.

15. An audio system for a vehicle comprising:

a source of audio frequency signals;

at least one relatively small speaker having a cone with a known non-linear excursion characteristic; and a filter circuit having an input coupled to said source and an output coupled to said speaker, wherein said filter circuit dynamically changes its filtering characteristics in response to input signals exceeding a preset threshold for attenuating said signals and passing signals below said threshold without substantial attenuation, wherein said filter circuit comprises a state-variable filter having high and low pass outputs and a voltage controlled amplifier circuit having a control input coupled to said low pass output, an input coupled to said high pass output, and an output coupled to a control input of said state-variable filter.

16. The system as defined in claim 15 wherein said relatively small speaker is mounted to a headliner of the vehicle.

17. The system as defined in claim 16 and further including a current source amplifier having an input coupled to said state-variable filter and an output coupled to said relatively small speaker.

18. The system as defined in claim 17, wherein said low pass output of said state-variable filter is employed for applying signals therefrom to a larger diameter speaker.

19. The system as defined in claim 18 and further including a current sensing resistor coupled to said output of said current source amplifier and a feedback resistor coupling said current sensing resistor to said input of said current source amplifier.

\* \* \* \* \*